(12) United States Patent
Kim et al.

(10) Patent No.: US 11,442,305 B2
(45) Date of Patent: Sep. 13, 2022

(54) DISPLAY DEVICE

(71) Applicant: SAMSUNG DISPLAY CO., LTD., Yongin-si (KR)

(72) Inventors: Tae-Sung Kim, Hwaseong-si (KR); Young Ji Kim, Jeju-si (KR); Hyun Su Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 65 days.

(21) Appl. No.: 16/909,110

(22) Filed: Jun. 23, 2020

(65) Prior Publication Data

US 2021/0149241 A1 May 20, 2021

(30) Foreign Application Priority Data

Nov. 18, 2019 (KR) .................. 10-2019-0147644

(51) Int. Cl.
*G02F 1/1333* (2006.01)

(52) U.S. Cl.
CPC .. *G02F 1/133385* (2013.01); *G02F 1/133308* (2013.01); *G02F 2201/36* (2013.01)

(58) Field of Classification Search
None
See application file for complete search history.

(56) References Cited

U.S. PATENT DOCUMENTS 6,288,891 B1 * 9/2001 Hasegawa .............. F16M 11/10
 248/923
6,330,154 B1 * 12/2001 Fryers ................ H05K 7/20145
 361/695
8,331,577 B2 12/2012 Lyon et al.

FOREIGN PATENT DOCUMENTS

| JP | 2005-301905 | 10/2005 |
|---|---|---|
| KR | 10-1331488 | 11/2013 |
| KR | 10-1368837 | 3/2014 |
| KR | 10-1455224 | 10/2014 |
| KR | 10-2015-0112027 | 10/2015 |
| KR | 10-1564278 | 10/2015 |
| KR | 10-2016-0020551 | 2/2016 |
| KR | 10-2017-0108125 | 9/2017 |

* cited by examiner

*Primary Examiner* — Richard H Kim

(74) *Attorney, Agent, or Firm* — F. Chau & Associates, LLC

(57) ABSTRACT

A display device includes: a display panel; a stand disposed at a first side surface of the display panel; a blowing fan disposed inside the stand; and a duct disposed at a second side surface of the display panel and connected to the stand.

20 Claims, 11 Drawing Sheets

DISPLAY DEVICE

CROSS-REFERENCE TO RELATED APPLICATION

This application claims priority under 35 U.S.C. § 119 to Korean Patent Application No. 10-2019-0147644 filed in the Korean Intellectual Property Office on Nov. 18, 2019, the disclosure of which is incorporated by reference herein in its entirety.

TECHNICAL FIELD

The present invention relates to a display device, and more particularly, to a display device having a heat dissipation effect.

DISCUSSION OF THE RELATED ART

Display devices typically include a liquid crystal display (LCD), a plasma display panel (PDP), an organic light emitting diode (OLED) device, a field effect display (FED), an electrophoretic display device, or the like.

The light emitting diode device typically includes two electrodes and an emitting layer located therebetween, and excitons are generated by combining, at the emitting layer, electrons provided from one of the two electrodes and holes provided from the other electrode. Energy is outputted from the excitons as they approach a ground state, and thereby emit light.

In the light emitting diode device, a temperature inside the display device increases due to heat generated during a driving of the display device. In this case, as the temperature inside the display device increases, the light emitting layer that is vulnerable to heat may deteriorate. If the light emitting layer deteriorates, a lifespan of the organic light emitting diode device may be shortened and display quality may deteriorate.

SUMMARY

According to an exemplary embodiment of the present invention, a display device includes: a display panel; a stand disposed at a first side surface of the display panel; a blowing fan disposed inside the stand; and a duct disposed at a second side surface of the display panel and connected to the stand.

In an exemplary embodiment of the present invention, the stand includes: a body part in contact with the first side surface of the display panel; and a lower end connected to the body part.

In an exemplary embodiment of the present invention, the blowing fan is disposed in the lower end.

In an exemplary embodiment of the present invention, a length of the body part in a first direction is substantially the same as a length of the display panel in the first direction.

In an exemplary embodiment of the present invention, the duct includes: a first injection hole providing a passageway to an inside of the stand; a first passage extending along a first direction; and a first outlet connected to the first passage.

In an exemplary embodiment of the present invention, the first passage is stream-lined.

In an exemplary embodiment of the present invention, the first passage has a semi-circular or a semi-elliptical shape.

In an exemplary embodiment of the present invention, the first passage has a shape that becomes narrower as its upper portion is approached.

In an exemplary embodiment of the present invention, a width of the first injection hole is larger than a width of the first outlet.

In an exemplary embodiment of the present invention, the length of the first outlet in the first direction is substantially the same as the length of the display panel in the first direction.

In an exemplary embodiment of the present invention, the display device further includes: a circuit board connected to the display panel and disposed at the second side surface of the display panel; and a second side surface housing covering the circuit board and the duct.

In an exemplary embodiment of the present invention, the second side surface housing includes a hole.

According to an exemplary embodiment of the preset invention, a display device includes: a display panel; a stand disposed at a first side surface of the display panel; a blowing fan connected to the stand; and a duct disposed at the rear surface of the display panel and connected to the stand, wherein the duct includes a first injection hole providing a passageway to the stand, wherein air flows through the first injection hole; and a first discharge hole through which the air, from the first injection hole, flows out of.

In an exemplary embodiment of the present invention, the duct extends along a first direction, and a length of the duct in the first direction is substantially the same as a length of the display panel in the first direction.

In an exemplary embodiment of the present invention, the stand includes: a body part in contact with the first side surface of the display panel; and a lower end connected to the body part, wherein the blowing fan is disposed at the lower end.

In an exemplary embodiment of the present invention, the duct further includes a first passage connecting the first injection hole and the first discharge hole to each other.

In an exemplary embodiment of the present invention, the first passage has a streamline shape, a semi-circular shape, or a semi-elliptical shape.

In an exemplary embodiment of the present invention, the first passage includes an upper portion and a middle portion, wherein the upper portion is narrower than the middle portion.

In an exemplary embodiment of the present invention, a width of the first injection hole is larger than a width of the first discharge hole.

In an exemplary embodiment of the present invention, the display device further includes: a circuit board connected to the display panel and disposed at the rear surface of the display panel; and a rear surface housing covering the circuit board and the duct,
wherein the rear surface housing includes a first hole and a second hole.

DETAILED DESCRIPTION

Figure 1:
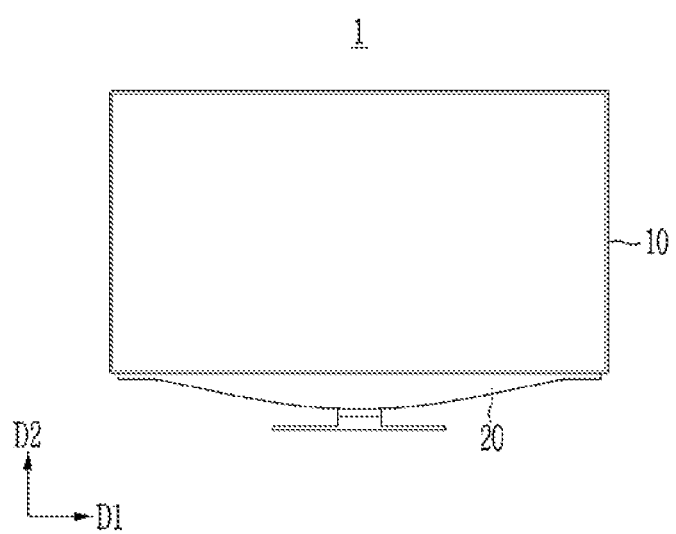
FIG. 1 is a front view of a display device according to an exemplary embodiment of the present invention.

Exemplary embodiments of the present invention will be described more fully hereinafter with reference to the accompanying drawings. It is to be understood that the described exemplary embodiments of the present invention may be modified in various different ways without departing from the spirit or scope of the present invention.

It is to be understood that like reference numerals may denote like elements throughout the specification, and thus, repetitive descriptions may be omitted.

In addition, the size and thickness of each element (e.g., layers, films, panels, regions, etc.) shown in the drawings may be exaggerated for clarity, but the present invention is not limited thereto.

It will be understood that when an element such as a layer, film, region, or substrate is referred to as being "on" another element, it can be directly on the other element or intervening elements may also be present. In addition, when an element is referred to as being "directly on" another element, there are no intervening elements present.

Further, in the specification, the phrase "in a plan view" means an object portion is viewed from above, and the phrase "in a cross-sectional view" means a cross-section of a target part, taken by vertically cutting an object portion, is viewed from the side.

Figure 2:
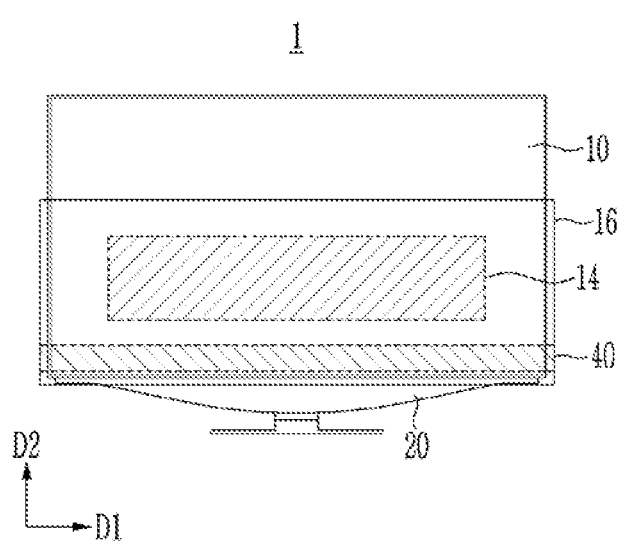
FIG. 2 is a rear view of a display device according to an exemplary embodiment of the present invention.
Figure 3:
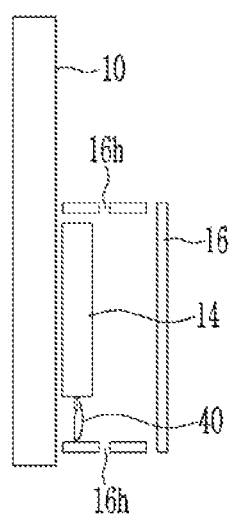
FIG. 3 is a cross-sectional view of a display device according to an exemplary embodiment of the present invention.
Figure 4:
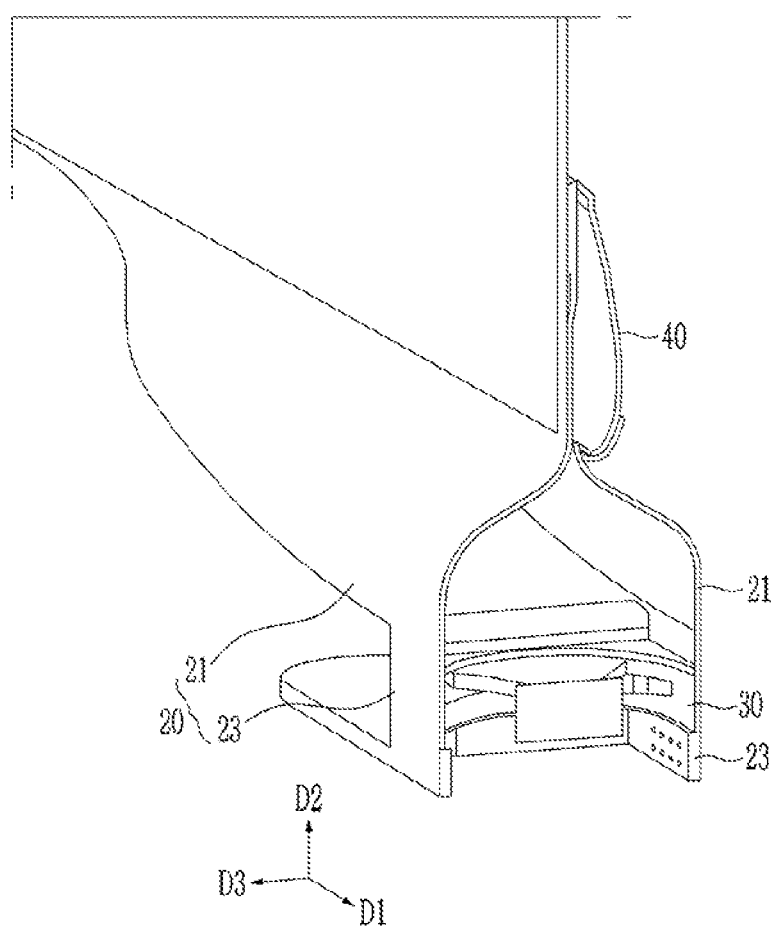
FIG. 4 and FIG. 5 are perspective views taken along a partial cross-sectional of a display device according to an exemplary embodiment of the present invention.
Figure 5:
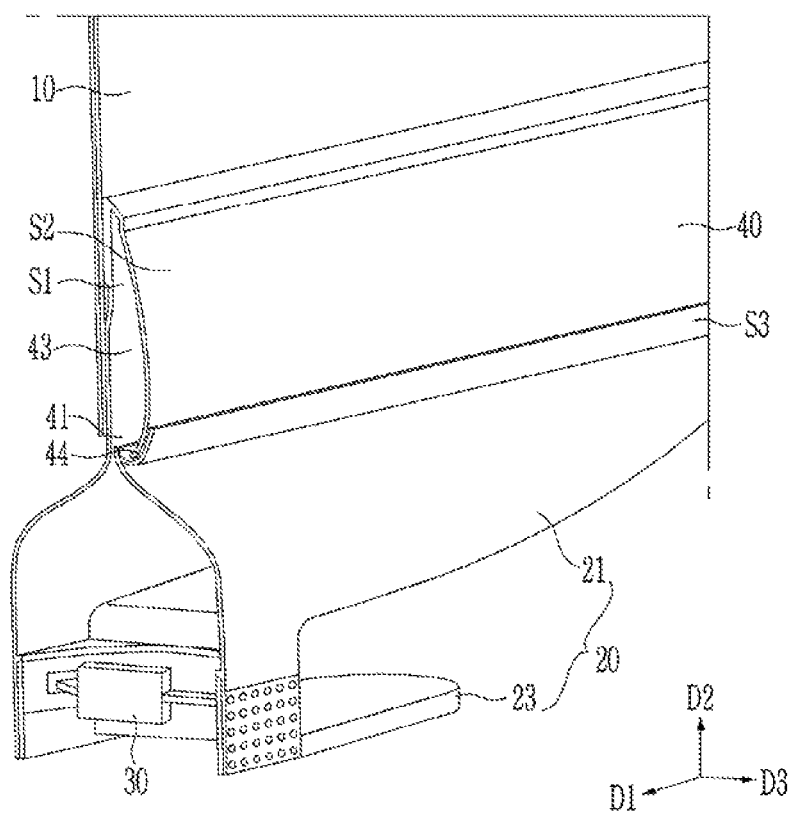

Now, a display device according to an exemplary embodiment of the present invention is described with reference to FIG. 1 to FIG. 5. FIG. 1 is a front view of a display device according to an exemplary embodiment of the present invention, FIG. 2 is a rear view of a display device according to an exemplary embodiment of the present invention, FIG. 3 is a cross-sectional view of a display device according to an exemplary embodiment of the present invention, and FIG. 4 and FIG. 5 are perspective views taken along a partial cross-section of a display device according to an exemplary embodiment of the present invention.

Referring to FIG. 1, a display device 1 according to an exemplary embodiment of the present invention may include a display panel 10 and a stand 20 connected to the display panel 10 to support the display panel 10. The display panel 10 may display an image.

The display panel 10 may be a light emitting display panel, but the present invention is not limited thereto, and may include various kinds of panels. For example, the display panel 10 may include a liquid crystal display panel, an electrophoretic display panel, an electrowetting display panel, or the like. In addition, the display panel 10 may include a display panel such as a micro light emitting diode (LED) display panel, a quantum dot light emitting diode (QLED) display panel, and a quantum dot organic light emitting diode (QD-OLED) display panel.

The stand 20 may have various shapes for supporting the display panel 10. The stand 20 may be in a hollow form through which air may flow. For example, the stand 20 may have openings for air to travel through. In addition, the stand 20 may have any shape having substantially the same length as that of the display panel 10 in the first direction D1. Uniform air flow may be provided to the entire area of the display panel 10 through the stand 20, and details thereof are described below.

Referring to FIG. 2 and FIG. 3, a circuit board 14 connected to the display panel 10 may be disposed at a rear surface of the display device 1 according to an exemplary embodiment of the present invention. In addition, a duct 40 may be disposed on a rear surface of the display panel 10. In addition, a rear surface housing 16 covering the duct 40 and the circuit board 14 may be disposed at the rear surface of the display device 1.

The rear surface housing 16 may have any form covering the duct 40 and the circuit board 14. For example, the rear surface housing 16 may have a cuboid shape. As an additional example, the rear surface housing 16 may have a box shape covering the duct 40 and the circuit board 14 according to an exemplary embodiment of the present invention.

The rear surface housing 16 may include a hole 16h. For example, the rear surface housing 16 may include at least at least one hole 16h. For example, the rear surface housing 16 may include a hole 16h disposed at the lower end of the rear surface housing 16 and a hole 16h disposed at the upper end thereof. However, the present invention is not limited thereto. For example, a hole may be positioned in a sidewall of the rear surface housing 16 facing the circuit board 14.

Air may be introduced into the rear surface housing 16 from the outside through the hole 16h disposed at the lower end of the rear surface housing 16. Air discharged through the duct 40 may be discharged to the outside of the rear surface housing 16 through the hole 16h positioned at the upper end of the rear surface housing 16. The air may be circulated through the holes 16h respectively positioned at upper and lower ends of the rear surface housing 16, and heat generated from the circuit board 14 may be discharged to the outside of the rear surface housing 16.

The stand 20 and the duct 40 are described in detail with reference to FIG. 4 and FIG. 5.

Referring to FIG. 4, the stand 20 according to an exemplary embodiment of the present invention may include a body part 21 and a lower end 23 supporting the display panel 10. The body part 21 may be connected to one side surface of the display panel 10, and the lower end 23 may be connected to the body part 21.

The lower end 23 may have a hollow shape. A blowing fan 30 may be disposed inside the hollow shape of the lower end 23. For example, the blowing fan 30 may be connected to the stand 20. The blowing fan 30 may provide the flow (e.g., wind) of air in the direction parallel to the second direction D2 crossing the first direction D1 according to an exemplary embodiment of the present invention.

In an exemplary embodiment of the present invention, a plurality of blowing fans may be disposed inside of the lower end 23.

The body part 21 may have the hollow shape. The body part 21 is a passage through which air provided from the blowing fan 30 may move to the duct 40. The maximum length of the body part 21 in the first direction D1 may be substantially the same as the maximum length of the display panel 10 extending in the first direction D1. The flow of air provided in the second direction D2 through the lower end 23 may diffuse along the body part 21 extending in the first direction D1 and may be provided to substantially the whole of one side surface of the display panel 10. For example, the lower end 23 may have a relatively narrow area.

Referring to FIG. 5, the duct 40 according to an exemplary embodiment of the present invention includes a first injection hole 41, a first passage 43, and a first outlet 44 (e.g., a first discharge hole).

The first injection hole 41 is a passageway for air to travel between with the stand 20, for example, the body part 21, and the duct 40. For example, the flow (e.g., wind) of the air generated from the blowing fan 30 may be introduced into the first injection hole 41 through the body part 21 from the lower end 23.

The first injection hole 41 may be located on one side of the display panel 10. The first injection hole 41 may have an extended shape to have a length substantially equal to the length in the first direction D1 of one side of the display panel 10.

The first passage 43 is a space in which the air introduced from the first injection hole 41 moves. The cross-section of the first passage 43 may be a stream-line type (e.g., have a streamline shape), and may have a shape that becomes narrower toward the upper portion from the lower portion along the second direction D2. For example, the upper portion of the first passage 43 is narrower than a middle portion of the first passage 43. For example, the first passage 43 may extend along the first direction D1.

The first outlet 44 may be connected to the first passage 43, and may be particularly disposed at the lower end of the first passage 43. The first outlet 44 may have a shape extending along the length direction (e.g., the first direction D1) of the first passage 43.

The duct 40 may be composed of a first surface S1, a second surface S2, and a third surface S3. In this case, the first surface S1 may be a surface facing the rear surface of the display panel 10, and the second surface S2 may be a surface extending from the upper portion of the first surface S1 toward the lower portion of the first surface S1 to form the first passage 43. The end of the third surface S3 may be connected to an end of the body part 21, and may have a shape extending along an outer surface of the second surface S2. The third surface S3 may overlap a part of the second surface S2. For example, the third surface S3 may extend along the outer surface of the curved shape of the second surface S2.

For example, the first injection hole 41 may be provided by a space between the first surface S1 and the third surface S3 of the duct 40. In addition, the first passage 43 may be provided by a space between the first surface S1 and the second surface S2. In addition, the first outlet 44 may be provided by a space between the second surface S2 and the third surface S3. Although the present invention describes that the third surface S3 extends along the outer surface of the second surface S2, the present invention is not limited thereto, and for example, the third surface S3 may extend along the inner surface of the second surface S2 to form the first outlet 44. In other words, the second surface S2 is disposed on the outer surface of the third surface S3.

In addition, the display device 1 according to an exemplary embodiment of the present invention may further include an active noise control unit.

The blowing fan 30 located inside the stand 20 may generate noise. For example, the generated noise may have a substantially constant frequency. The active noise control unit may generate sound waves capable of canceling the wavelength of the noise generated by the blowing fan 30, thereby blocking noise generated from the blowing fan 30.

The active noise control unit may include an analysis board for analyzing the noise generated from the blowing fan 30 and a speaker for generating sound waves of a predetermined frequency, but the present invention is not limited thereto. The active noise control unit may include a microphone for measuring noise adjacent to the stand 20, and may analyze the noise collected through the microphone through an analysis board. For example, the frequency and phase of noise may be analyzed. After that, the active noise control unit may block the noise by generating sound waves of a phase that is reversed with respect to the sound waves that form the noise.

Figure 6:
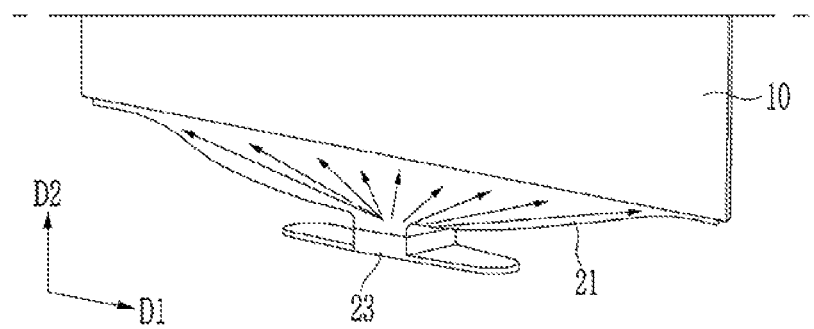
FIG. 6, FIG. 7, and FIG. 8 are views showing air flow for a display device according to an exemplary embodiment of the present invention.
Figure 7:
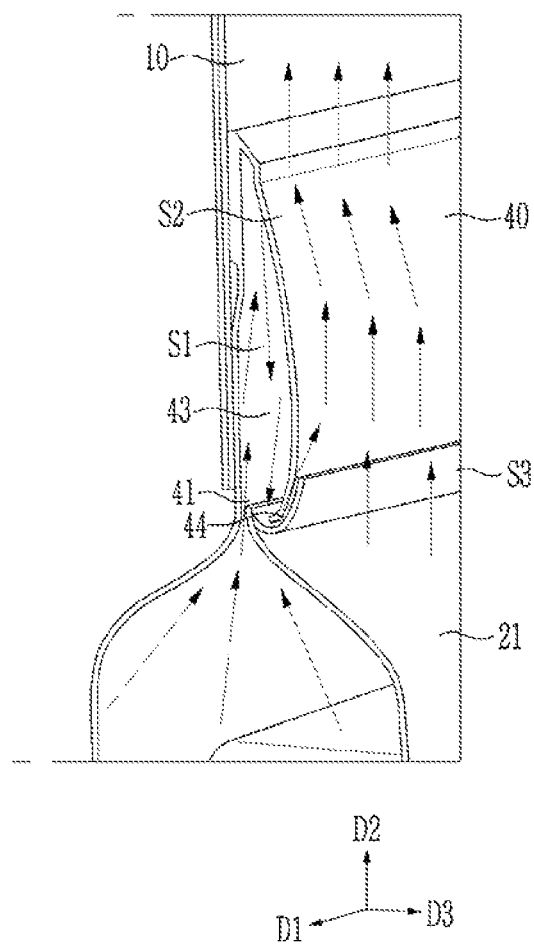
Figure 8:
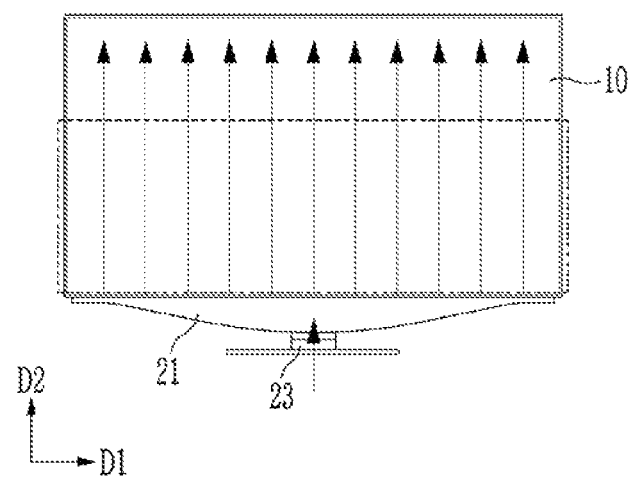

The air flow in the rear surface of the display device according to an exemplary embodiment of the present invention is described with reference to FIG. 6 to FIG. 8. FIG. 6, FIG. 7, and FIG. 8 are views showing an air flow for a display device according to an exemplary embodiment of the present invention.

Referring to FIG. 6, the air moving in the second direction D2 through the blowing fan disposed inside the lower end 23 passes through the body part 21. In this case, the air may be diffused along the length direction (e.g., the first direction D1) of the body part 21. In other words, the air may be provided to overlap substantially the entirety of one side surface of the display panel 10.

Next, as shown in FIG. 7, the air passing through the body part 21 inflows into the first injection hole 41 of the duct 40. The air introduced into the first injection hole 41 moves along the first surface S1 and hits an upper surface of the first passage 43 to again move along the second surface S2. The air moves downward along the second surface S2 and moves to the outside of the duct 40 through the first outlet 44. The air moving through the first outlet 44 may be discharged at a substantially uniform pressure along the first direction D1 of the display panel 10.

Thereafter, the air moved between the second surface S2 and the third surface S3 moves toward the rear surface of the display panel 10 along the outer surface of the second surface S2 (e.g., a Coanda effect). The air moves along the outer surface of the second surface S2, and the flow of the air induces a new flow of the air disposed nearby, so that the surrounding air moves along the outer surface of the second surface S2 where the pressure is lowered. An amount of air that is larger than the amount of air discharged through the first outlet 44 may move along the outer surface of the second surface S2.

Subsequently, as shown in FIG. 8, a large amount of the air flows in the upper direction from the lower side of the rear surface of the display panel 10.

When the blowing fan is disposed on the rear surface of the display panel, a local heat dissipation effect may occur only in a partial region where the blowing fan is disposed. However, the display device according to an exemplary embodiment of the present invention may provide substantially uniform air flow to substantially the entire rear surface of the display panel 10 by using the minimum number of blowing fans disposed on the stand 20. As a result, an increase in the temperature of the display panel and the circuit board may be prevented, and the heat dissipation effect of the display device may be increased.

Figure 9:
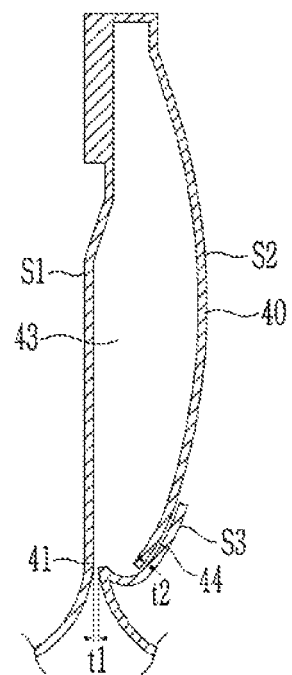
FIG. 9, FIG. 10, and FIG. 11 are cross-sectional views of a duct according to an exemplary embodiment of the present invention.
Figure 10:
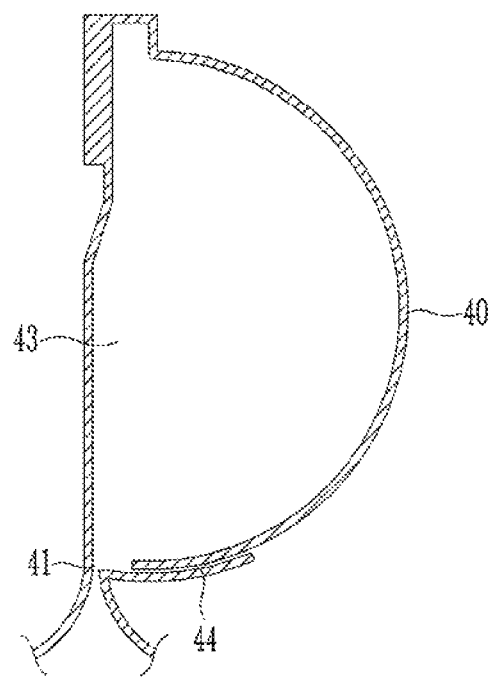
Figure 11:
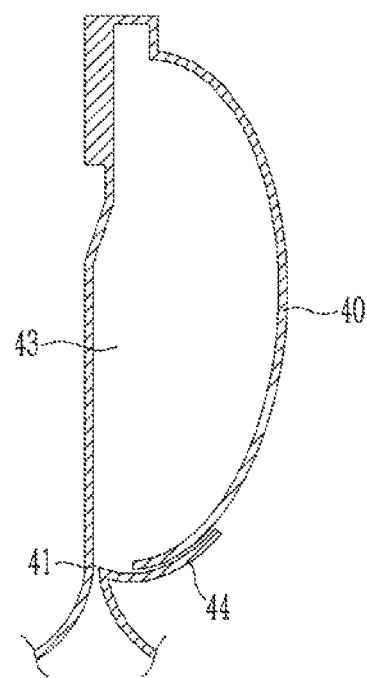

In addition, the duct according to an exemplary embodiment of the present invention is described with reference to FIG. 9 to FIG. 11. FIG. 9, FIG. 10, and FIG. 11 are cross-sectional views of a duct according to an exemplary embodiment of the present invention. Such a duct may be applied to the display device described above, and the description of the same components as the above-described components may be omitted.

Referring to FIG. 9, the first injection hole 41 may be a space between the end of the first surface S1 and the end of the third surface S3, and a width t1 of the first injection hole 41 may be a shortest distance between the end of the first surface S1 and the end of the third surface S3. In addition, the first outlet 44 may be a space between the end of the second surface S2 and the end of the third surface S3, and a width t2 of the first outlet 44 may be a shortest distance between the end of the second surface S2 and the end of the third surface S3.

The width t1 of the first injection hole 41 of the duct 40 according to an exemplary embodiment of the present invention may be larger than the width t2 of the first outlet 44. The wind supplied from the blowing fan may be provided through the first inlet 41, and the wind flowing through the first outlet 44 may move along the outer side of the second surface S2 through a relatively narrow gap. When the amount of the discharged air from the first outlet 44 is small compared to the injected air through the first injection hole 41, the air pressure may be increased such that the moving speed of the air may increase. For example, the flow of the air provided in the upper direction of the display panel 10 through the duct 40 may be faster, and the heat dissipation effect may be increased.

Referring to FIG. 10 and FIG. 11, the first passage 43 is a space where the air provided from the first injection hole 41 moves. The cross-section of the first passage 43 may have a semi-circular shape as shown in FIG. 10, or a semi-elliptical shape in which the ellipse elongated along the second direction is cut in half as shown in FIG. 11.

The cross-section of the first passage 43 is not limited to the above-described shape, but if it includes a curved shape in which the air moving through the first outlet 44 may move along the outer surface of the second surface S2, any shape with a curvature may be used.

The display device according to an exemplary embodiment of the present invention includes the blowing fan disposed inside the stand and the duct disposed on the rear surface of the display panel. Accordingly, although a heat dissipation member is not separately included in the display panel, the wind generated from the blowing fan may be provided to the entire rear surface of the display panel while passing through the duct.

In addition, the display device according to the exemplary embodiment of the present invention may minimize noise and vibration by using a minimum number of blowing fans and freedom of design of the display device may be secured. As it also includes a minimum number of blowing fans, it may be easier to block the noise or vibration generated from the blowing fan. The display device according to the exemplary embodiment of the present invention may prevent the temperature of the display panel from rising due to heat generation of the display panel, heat generation of the circuit board, and the like, and reliability of the display device may be increased.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a display panel;
a stand disposed at a first side surface of the display panel;
a blowing fan disposed inside the stand; and
a duct disposed at a second side surface of the display panel and connected to the stand,
wherein the blowing fan is disposed under the display panel, and air discharged from the blowing fan passes through the duct and is provided on the entire rear surface of the display panel.

2. The display device of claim 1, wherein
the stand includes:
a body part in contact with the first side surface of the display panel; and
a lower end connected to the body part.

3. The display device of claim 2, wherein:
the blowing fan is disposed in the lower end.

4. The display device of claim 2, wherein:
a length of the body part in a first direction is substantially the same as a length of the display panel in the first direction.

5. The display device of claim 1, wherein
the duct includes:
a first injection hole providing a passageway to an inside of the stand;
a first passage extending along a first direction; and
a first outlet connected to the first passage.

6. The display device of claim 5, wherein
the first passage is stream-lined.

7. The display device of claim 5, wherein
the first passage has a semi-circular or a semi-elliptical shape.

8. The display device of claim 5, wherein
the first passage has a shape that becomes narrower as its upper portion is approached.

9. The display device of claim 5, wherein
a width of the first injection hole is larger than a width of the first outlet.

10. The display device of claim 5, wherein
the length of the first outlet in the first direction is substantially the same as the length of the display panel in the first direction.

11. The display device of claim 1, further comprising:
a circuit board connected to the display panel and disposed at the second side surface of the display panel; and
a second side surface housing covering the circuit board and the duct.

12. The display device of claim 11, wherein
the second side surface housing includes a hole.

13. A display device comprising:
a display panel;
a stand disposed at a first side surface of the display panel;
a blowing fan connected to the stand; and
a duct disposed at the rear surface of the display panel and connected to the stand,
wherein the duct includes
a first injection hole providing a passageway to the stand, wherein air flows through the first injection hole; and
a first discharge hole through which the air, from the first injection hole, flows out of, and
wherein the blowing fan is disposed under the display panel, and air discharged from the blowing fan passes through the duct and is provided on the entire rear surface of the display panel.

14. The display device of claim 13, wherein
the duct extends along a first direction, and
a length of the duct in the first direction is substantially the same as a length of the display panel in the first direction.

15. The display device of claim 13, wherein
the stand includes:

a body part in contact with the first side surface of the display panel; and a lower end connected to the body part, wherein the blowing fan is disposed at the lower end.

16. The display device of claim 13, wherein the duct further includes a first passage connecting the first injection hole and the first discharge hole to each other.

17. The display device of claim 16, wherein the first passage has a streamline shape, a semi-circular shape, or a semi-elliptical shape.

18. The display device of claim 16, wherein the first passage includes an upper portion and a middle portion, wherein the upper portion is narrower than the middle portion.

19. The display device of claim 13, wherein a width of the first injection hole is larger than a width of the first discharge hole.

20. The display device of claim 13, further comprising:

a circuit board connected to the display panel and disposed at the rear surface of the display panel; and a rear surface housing covering the circuit board and the duct, wherein the rear surface housing includes a first hole and a second hole.

* * * * *